US009978686B1

(12) United States Patent
Spry et al.

(10) Patent No.: US 9,978,686 B1
(45) Date of Patent: May 22, 2018

(54) INTERCONNECTION OF SEMICONDUCTOR DEVICES IN EXTREME ENVIRONMENT MICROELECTRONIC INTEGRATED CIRCUIT CHIPS

(71) Applicant: The United States of America as represented by the Administrator of NASA, Washington, DC (US)

(72) Inventors: David J. Spry, Medina, OH (US); Philip G. Neudeck, Olmsted Township, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 0 days. days.

(21) Appl. No.: 15/438,130

(22) Filed: Feb. 21, 2017

Related U.S. Application Data

(60) Provisional application No. 62/297,393, filed on Feb. 19, 2016.

(51) Int. Cl.
| | | |
|---|---|---|
| *H01L 23/34* | (2006.01) | |
| *H01L 23/532* | (2006.01) | |
| *H01L 23/522* | (2006.01) | |
| *H01L 21/768* | (2006.01) | |
| *H01L 21/311* | (2006.01) | |

(52) U.S. Cl.
CPC .. *H01L 23/53266* (2013.01); *H01L 21/31116* (2013.01); *H01L 21/7685* (2013.01); *H01L 21/76802* (2013.01); *H01L 21/76879* (2013.01); *H01L 23/5226* (2013.01)

(58) Field of Classification Search
CPC ..... H01L 23/5381; H01L 24/96; H01L 24/97; H01L 2224/4824; H01L 25/072; H01L 24/40
USPC ........ 257/723, 724, 758, 776; 438/622, 637, 438/107, 110
See application file for complete search history.

(56) References Cited

U.S. PATENT DOCUMENTS

| | | |
|---|---|---|
| 4,920,071 A | 4/1990 | Thomas |
| 5,834,840 A | 11/1998 | Robbins et al. |
| 6,576,967 B1 | 6/2003 | Schaeffer, III et al. |
| 7,211,864 B2 | 5/2007 | Seliskar |
| 7,335,972 B2 | 2/2008 | Chanchani |
| 7,439,139 B2 | 10/2008 | Seliskar |
| 8,058,137 B1 | 11/2011 | Or-Bach et al. |
| 8,237,228 B2 | 8/2012 | Or-Bach et al. |
| 8,436,426 B2 | 5/2013 | Le Neel et al. |
| 8,598,709 B2 * | 12/2013 | Meyer .................. H01L 21/568 257/685 |
| 8,703,605 B2 | 4/2014 | Yang |
| 8,742,576 B2 * | 6/2014 | Thacker ................. H01L 24/72 174/250 |

(Continued)

*Primary Examiner* — S. V Clark
(74) *Attorney, Agent, or Firm* — Robert H. Earp, III

(57) ABSTRACT

A process of fabrication and the resulting integrated circuit device is made of patterned metal electrical interconnections between semiconductor devices residing on and forming extremely harsh environment integrated circuit chips. The process enables more complicated wide band gap semiconductor integrated circuits with more than one level of interconnect to function for prolonged time periods (over 1000 hours) at much higher temperatures (500 C).

19 Claims, 16 Drawing Sheets

(56) References Cited

U.S. PATENT DOCUMENTS

| | | | |
|---|---|---|---|
| 8,779,583 B2* | 7/2014 | Pressel | H01L 25/50 |
| | | | 257/684 |
| 8,840,981 B2 | 9/2014 | Sieber | |
| 8,865,599 B2 | 10/2014 | Bai et al. | |
| 8,901,748 B2* | 12/2014 | Manusharow | H01L 25/0655 |
| | | | 257/652 |
| 8,987,602 B2 | 3/2015 | Hurwitz et al. | |
| 2010/0019370 A1* | 1/2010 | Pressel | B81B 7/02 |
| | | | 257/690 |
| 2011/0285006 A1* | 11/2011 | Weng | H01L 23/13 |
| | | | 257/686 |
| 2014/0061637 A1 | 3/2014 | Gu | |

\* cited by examiner

Micrograph of showing focus-ion beam milled trench revealing cross-section of experimentally fabricated two-level interconnect process on SiC JFET IC wafer.

INTERCONNECTION OF SEMICONDUCTOR DEVICES IN EXTREME ENVIRONMENT MICROELECTRONIC INTEGRATED CIRCUIT CHIPS

CROSS REFERENCE TO RELATED APPLICATIONS

This application claims the benefit of U.S. Provisional Patent application, Ser. No. 62/297,393, entitled "PROCESS FOR INTERCONNECTION OF SEMICONDUCTOR DEVICES IN EXTREME ENVIRONMENT MICROELECTRONIC INTEGRATED CIRCUIT CHIPS" and filed Feb. 19, 2016, which is hereby incorporated by reference herein.

ORIGIN OF THE INVENTION

The invention described herein was made by employees of the United States Government and may be manufactured and used by or for the Government for Government purposes without the payment of any royalties thereon or therefore.

FIELD OF THE INVENTION

The invention is in the field of semiconductor devices. In particular, wide band gap semiconductor integrated circuits for use in high temperature and prolonged time period applications.

BACKGROUND

Extending the operating temperature of useful transistor integrated circuits (ICs) well above the effective 300 C limit of silicon-on-insulator technology is expected to enable important improvements to aerospace, automotive, energy production, and other industrial systems. It is difficult to achievestable IC operation over prolonged time periods (e.g. many thousands of hours) at high temperature. Transistors can be implemented using wide band gap semiconductors and have demonstrated the ability to function at 500 Celsius (C). For example, silicon carbide (SiC) or ICs formed by microlithographically interconnecting these transistors on a single semiconductor chip. However, these demonstrations have been limited in either the amount of time that they can function at 500 C, or in circuit complexity. Previously, no IC has been implemented in any semiconductor material with more than 10 transistors interconnected on a single chip has demonstrated operation for more than 200 hours at 500 C.

Processes for interconnecting transistors (or other devices such as resistors) residing on a semiconductor chip using micro lithographical patterning of metal interconnects residing on insulating dielectric materials are well known to those skilled in the art.

In particular, FIG. 1 illustrates a prior art "first level" interconnect that is implemented in microscopic dimensions. The first level interconnect electrically connects semiconductor device 102 with semiconductor device 104 wherein both devices reside on the same semiconductor chip 106. A dielectric layer 108 overlying on both devices provides for electrical insulation or isolation from other devices and from overlying electrically conductive interconnect metal. At selected locations, patterned vias through the dielectric layer 108 are formed to enable subsequent deposition of conductive metal 110 to physically and electrically contact each semiconductor device 102, 104. The patterning of both vias and interconnect metal 112 is such that semiconductor device 102 and semiconductor device 104 become electrically interconnected for desired circuit functionality while providing device isolation from other circuit elements (devices and/or interconnects) according to the intended circuit design. For more complicated IC's these vias are generally small, yet within that small area provide for sufficient electrical conduction to the semiconductor devices 102, 104 (i.e, form sufficiently low-resistance ohmic contact to the semiconductor device, known in the art).

Conventional IC chips operating at temperatures less than 125 C (such as chips in cell phones and computers) can contain over a million interconnections that are small, and function reproducibly and reliably. However, the prior-art materials and processing ICs used for temperatures less than 125 C cannot reproducibly and reliably withstand 500 C extreme temperatures. FIG. 2 illustrates a prior art addition of a second dielectric layer 200 to create a second interconnect 202 that electrically connects to the first interconnect 112 through second via 204, that is then over coated by a protective third dielectric layer 206.

BRIEF DESCRIPTION

This brief description is provided to introduce a selection of concepts in a simplified form that are described below in the detailed description. This brief description is not intended to be an extensive overview of the claimed subject matter, identify key factors or essential features of the claimed subject matter, nor is it intended to be used to limit the scope of the claimed subject matter.

As discussed above, a process of making patterned metal electrical interconnections between semiconductor devices residing on and forming extremely harsh environment integrated circuit chips for accomplishing prolonged operation in such harsh environment for ICs comprised of more than 10 transistors has not previously existed. The process and device described herein enables more complicated (e.g., over 10 transistors) wide band gap semiconductor integrated circuits with more than one level of interconnect that functions for prolonged time periods (e.g. over 1000 hours) and at much higher temperatures (e.g. temperatures greater than or equal to 500 C) than previously achieved.

The innovation disclosed and claimed herein, in one aspect thereof, comprises systems and fabrication methods of an integrated circuit device. A first semiconductor device and a second semiconductor device are deposited (e.g. constructed) on the substrate using semiconductor processing. A first insulating layer is deposited that covers substantially the first semiconductor device, the second semiconductor device, and the substrate and its lateral extent (substrate lateral area). A patterned photoresist is deposited and patterned over the first insulating layer. The patterned photoresist defines a pattern for a first via to the first semiconductor device through the first insulating layer and a second via for the second semiconductor device through the first insulating layer. The first via and the second via is etched through the first insulating layer using the patterned photoresist as an etch mask that confines etching of the first insulating layer to occur only in regions where there is no overlying photoresist. Except for small-dimension lateral over-etch to be described, the first insulating layer is preserved (not etched) in regions directly beneath photoresist.

A contact metal layer is deposited onto the substrate lateral area including the first semiconductor device and the second semiconductor device and regions with patterned photoresist. A protective layer is deposited onto the substrate lateral area including the contact metal layer and regions with the patterned photoresist. When the patterned photoresist is removed (e.g. using a liquid chemical solvent dissolution process) along with the metals that resided on top of the photoresist, the contact metal layer and protective layer remain in regions on the first and second semiconductor devices where there was no overlying photoresist at the time that contact metal layer and protective layers were deposited. A first interconnect metal layer is deposited and patterned. The first interconnect metal layer electrically connects the first semiconductor device to the second semiconductor device via the contact metal layer and the protective layer.

A second insulating layer is deposited over the substrate lateral area including first interconnect metal layer. A third via is pattern etched through part of the second insulating layer to the first interconnect metal layer. A second interconnect metal layer is deposited and patterned including into the third via deposited over the patterned first interconnect metal layer such that the third via is filled with the second interconnect metal layer. A third insulating layer is deposited over the substrate lateral area including the second interconnect metal layer to complete an integrated circuit.

In aspects of the innovation, an integrated circuit device has a plurality of layers. The layers include a substrate, a first semiconductor device deposited onto a portion of the substrate, and a second semiconductor device deposited onto a second portion of the substrate such that the second semiconductor device is spaced from the first semiconductor device to facilitate intended electrical functionality. A first insulating layer that is deposited and then patterned onto part of the first semiconductor device, part of the second semiconductor device, and the substrate.

A contact metal layer that is patterned onto the part of the first semiconductor device and the part of the second semiconductor that is not covered by the patterned first insulating layer. A protective layer that is patterned onto the contact metal layer. A first patterned interconnect metal layer that electrically connects the first semiconductor to the second semiconductor via the patterned contact metal layer and the patterned protective layer. A second insulating layer that is patterned over the substrate lateral area including part of the first interconnect metal layer, wherein the second insulating layer patterning leaves a second via. A second interconnect metal layer that is deposited and patterned over the substrate lateral area including over the remaining part of the first interconnect metal layer such that the second via is filled with the second interconnect metal layer. A third insulating layer that is deposited and patterned over the substrate lateral area including over the patterned second interconnect metal layer.

In aspects, the innovation provides substantial benefits in terms of integrated circuits that can function over long periods at high temperatures. One advantage resides in using the same photoresist pattern for patterning a dielectric via with a combination of dry and wet etching as well as liftoff patterning of a 500 C durable SiC metal-semiconductor contact and a 500 C durable protective metal over layer. Another advantage resides in deposition and subsequent successful liftoff patterning of successful 500 C prolonged-durability SiC ohmic contact layers (e.g., Ti and Hf demonstrated) and oxidation-resistant high temperature protective cap metal without pre-deposition thermal "bake" sample treatment and with abundant photoresist on the sample.

Another advantage resides in deposition and use of highly dense and uniform and 500 C durable $TaSi_2$ films using close-proximity UHV sputter deposition process and apparatus. Yet another advantage resides in the use of hafnium as a durable high temperature ohmic contact to heavily doped ion implanted 4H—SiC. Still further advantages are apparent and will become apparent to those skilled in the art.

The following description and drawings set forth certain illustrative aspects and implementations. These are indicative of but a few of the various ways in which one or more aspects may be employed. Other aspects, advantages, or novel features of the disclosure will become apparent from the following detailed description when considered in conjunction with the drawings.

BRIEF DESCRIPTION OF THE DRAWINGS

The accompanying drawings, which are incorporated in and constitute a part of the specification, illustrate various systems, methods, and other embodiments of the disclosure. Illustrated element boundaries (e.g., boxes, groups of boxes, or other shapes) in the figures represent one example of the boundaries. In some examples one element may be designed as multiple elements or multiple elements may be designed as one element. In some examples, an element shown as an internal component of another element may be implemented as an external component and vice versa.

DETAILED DESCRIPTION

Figure 1:
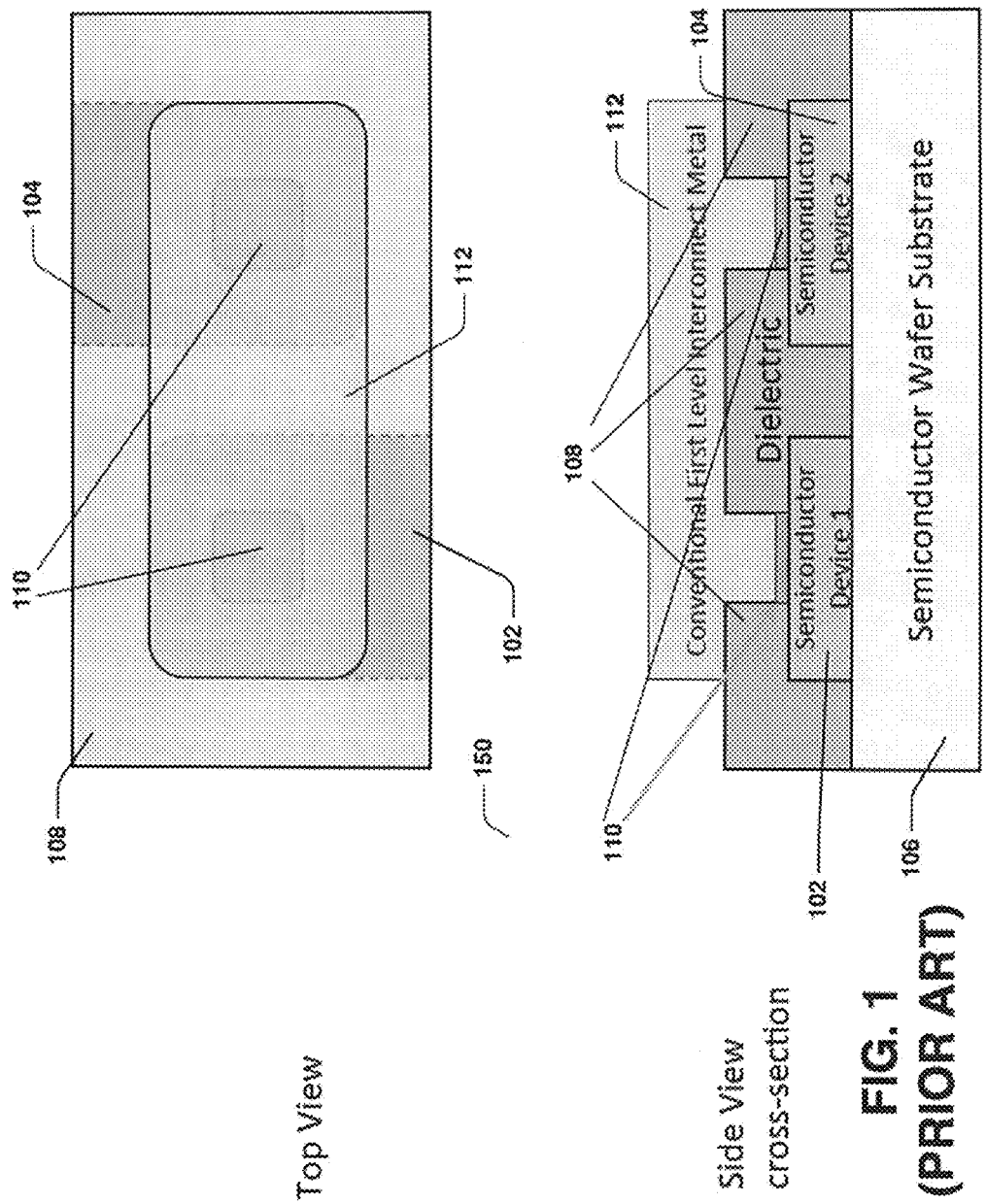
FIG. 1 illustrates a prior art "first level" interconnect that is implemented in microscopic dimensions.
Figure 2:
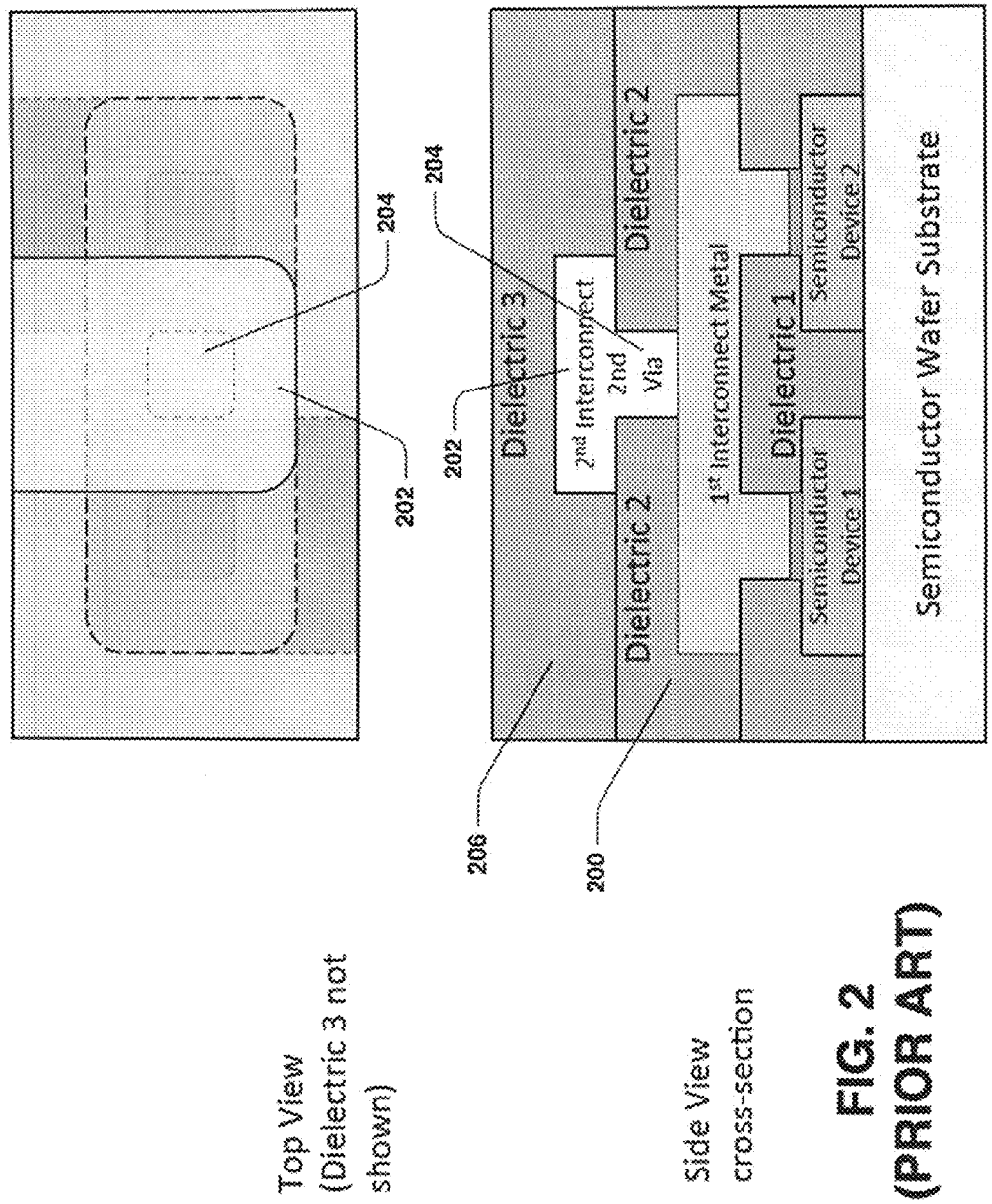
FIG. 2 illustrates a prior art addition of a "second level" interconnect on top of "first level" interconnect that is implemented in microscopic dimensions.

Embodiments or examples illustrated in the drawings are disclosed below using specific language. It will nevertheless be understood that the embodiments or examples are not intended to be limiting. Any alterations and modifications in the disclosed embodiments and any further applications of the principles disclosed in this document are contemplated as would normally occur to one of ordinary skill in the pertinent art. Described herein are examples of systems, methods, and other embodiments associated with interconnection of semiconductor devices in extreme environment microelectronic integrated circuit chips.

Figure 3:
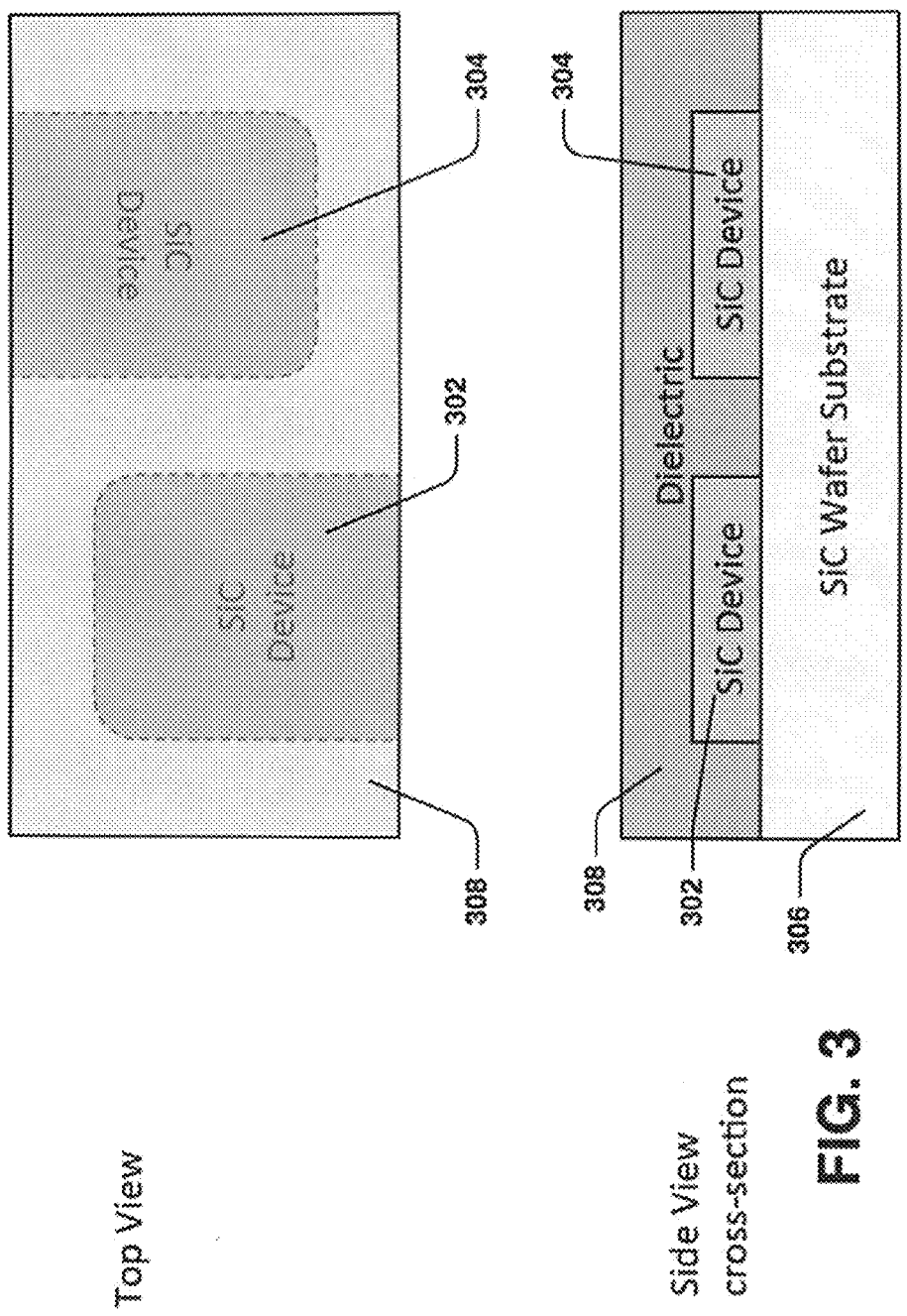
FIGS. 3-12 illustrate diagrams of intermediary steps in a fabrication process of an integrated circuit device according to aspects herein.

The following process interconnects a semiconductor device to facilitate fabrication of complex integrated circuits that durably function beyond extreme temperatures for extended time periods. FIG. 3 illustrates in two semiconductor devices 302 and 304 residing on a substrate 306. In some embodiments, the semiconductor devices are on a microscopic scale. In some embodiments, the semiconductor used is silicon carbide (SiC). For explanation purposes, a top view and a cross-sectional side view of said devices are illustrated. The top view is meant to show the top layers of the cross sectional view, however for disclosure purposes, some underlying layers may be depicted. It is appreciated that either semiconductor device 302, 304 can be a transistor, resistor, diode, detector, or other semiconductor device. In some embodiments, the top surfaces of the semiconductor devices 302, 304 are heavily doped in selected contact via regions (described in detail infra) to facilitate subsequent formation of ohmic metal-semiconductor (e.g. SiC) contacts. In some embodiments, heavy doping in a semiconductor device can also reside in regions where there are no contacts and/or no vias (described in detail infra).

In some embodiments, the two semiconductor devices 302, 304 are patterned and doped to provide semiconductor device electrical functionality. In an experimental embodiment, the semiconductor devices 302, 304 are 4H—SiC junction field effect transistors (JFETs) and 4H—SiC resistors. It is appreciated that the semiconductor devices 302, 304 can employ different arrangements. For example, semiconductor device 302 can be one end of a JFET, while semiconductor device 304 could be one end of a resistor. Alternatively, semiconductor device 302 can be one end of a JFET and semiconductor device 304 can be one end of a different JFET. In another example, semiconductor device 302 can be one end of a resistor, and semiconductor device 304 can be one end of another resistor.

It is appreciated that such JFET and resistor devices usually have more than one ohmic metal-semiconductor contact. For illustrative simplicity one ohmic contact region/end of each such device are illustrated in the figures instead of an entire JFET or resistor structure.

At this stage of the fabrication, a substrate lateral area that includes the semiconductor devices 302, 304 are covered by a first layer (or layers) of a dielectric insulating material 308. It is appreciated that depositing or covering refers to covering the substrate lateral area. The depositing covers all existing features regardless of the underlying structure over the substrate lateral area of a substrate chip/wafer.

The first dielectric 308 provides for electrical insulation for the circuit. The first dielectric 308 can insulate the semiconductor devices 302, 304 and substrate 308 from interconnect layers to be formed as described infra. In some embodiments, the first dielectric 308 is selected to maximize insulation while minimizing formation of physical cracks due to thermally-induced stresses over the entire operating temperature range of the IC. In some embodiments, the first dielectric 308 is comprised of an approximately 400 nanometer layer thick silicon dioxide (SiO2) that is grown via thermal oxidation of SiC and resides beneath an approximately 1 micrometer thick SiO2 deposited at 720 C by low-pressure chemical vapor deposition (LPCVD) using a tetraethyl orthosilicate (TEOS) precursor.

Figure 4:
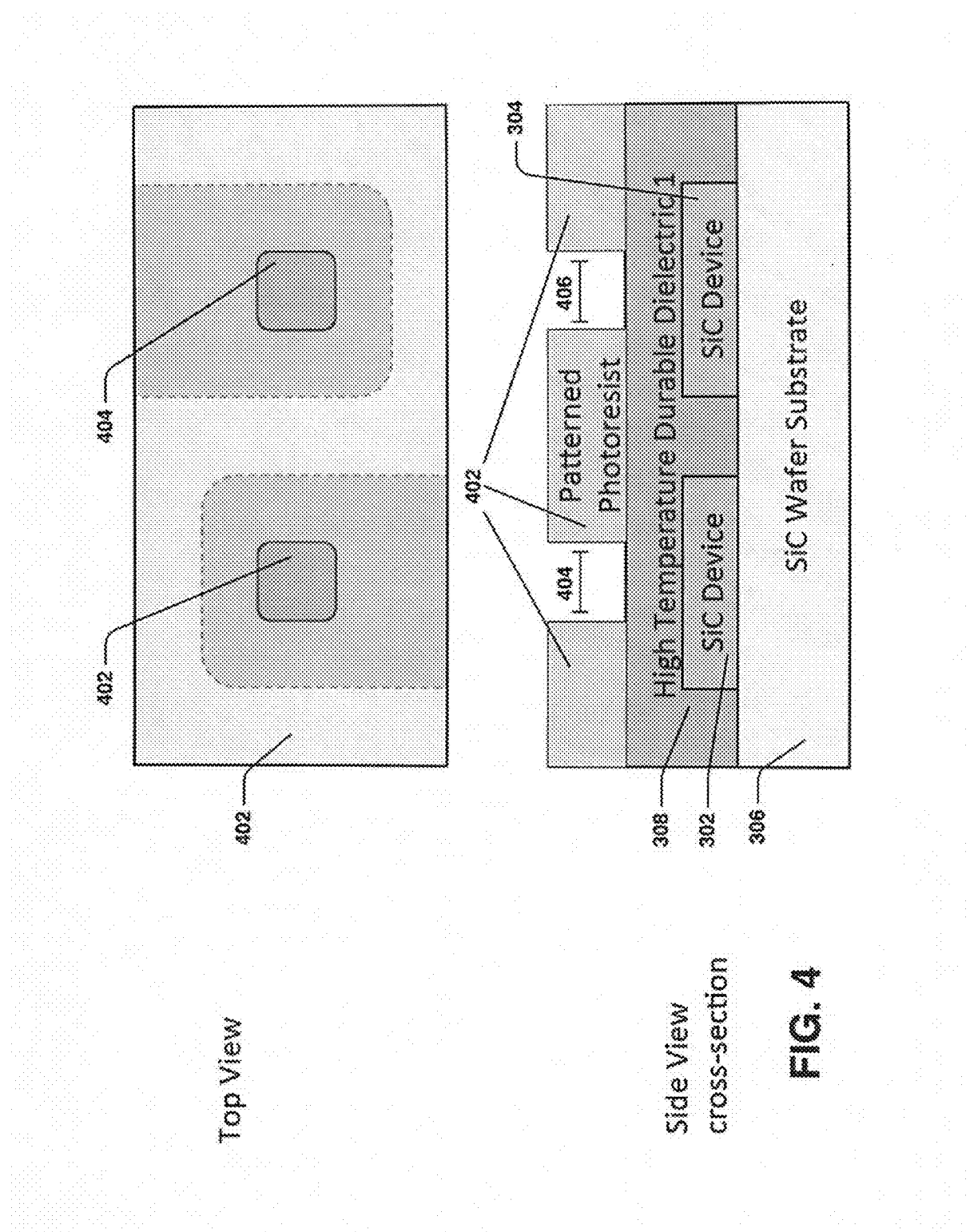

FIG. 4 illustrates the photolithographic pattern definition of photoresist 402 that will define uncovered regions 404 and 406 devoid of photoresist where vias can form via plug contacts to the semiconductor devices 302, 304.

Figure 5:
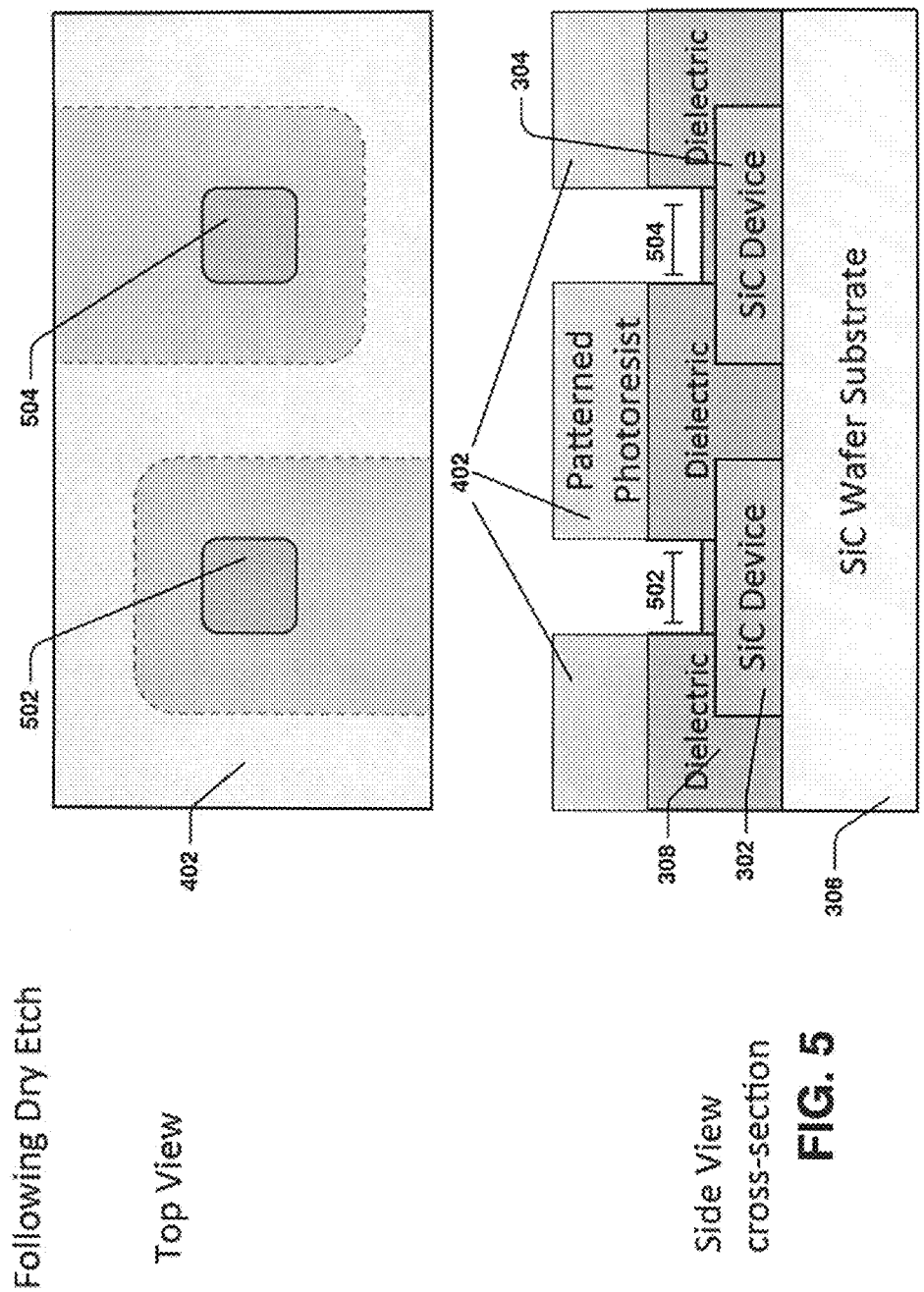
Figure 6:
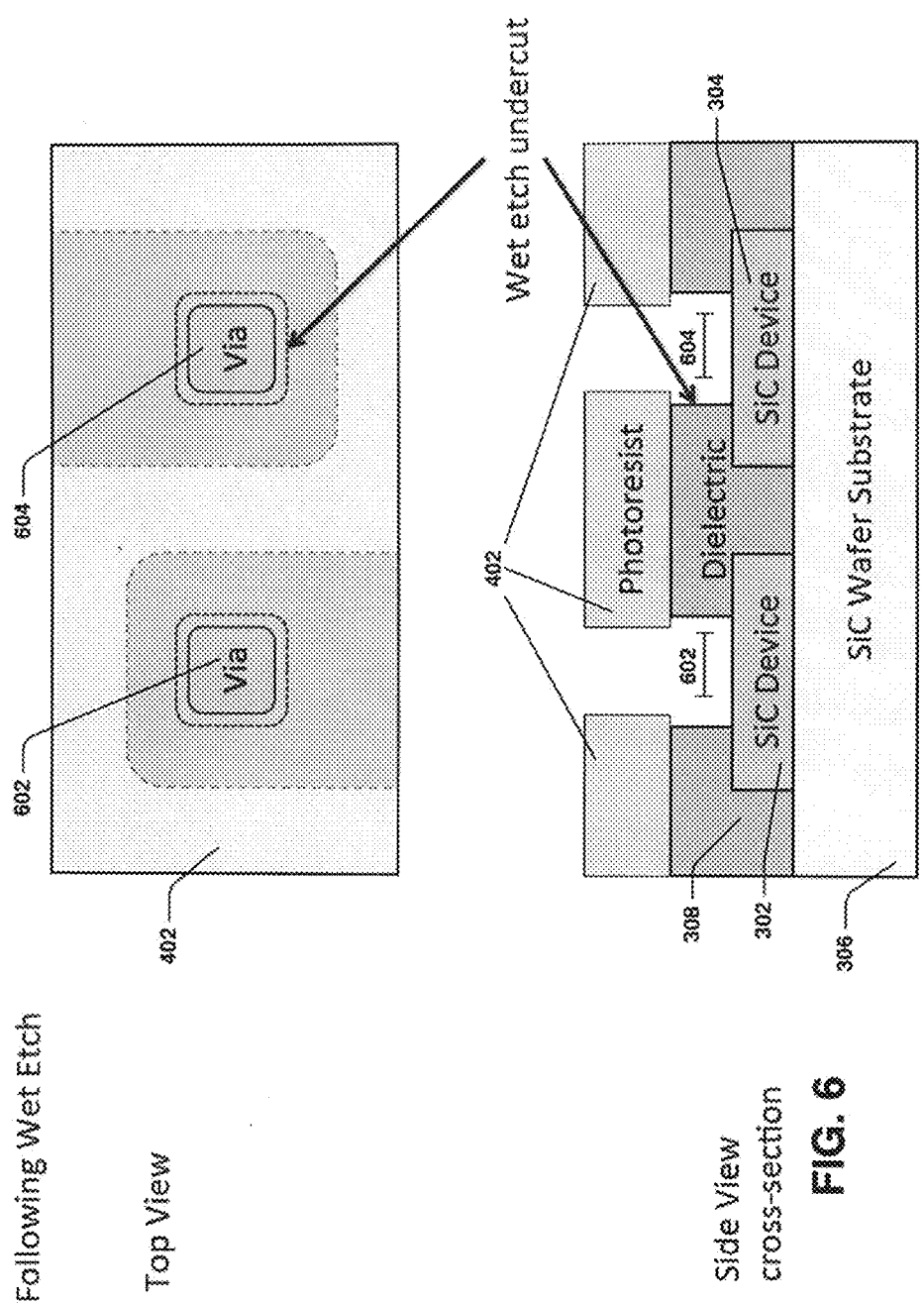

FIG. 5 and FIG. 6 illustrates the removal of the first dielectric 308 in the uncovered regions 404, 406 by photoresist-patterned etching to form intermediary vias 502, 504, and final (first and second) vias 602, 604 through the first dielectric 308, which exposes selected SiC surfaces of the underlying SiC devices 302, 304. In some embodiments, the lateral dimensions of the vias 502, 504, 602, 604 are preferably less than 10 micrometers. In other embodiments, the etching can be accomplished using a combination of dry and/or wet etching, wherein the etching removal of the first dielectric 308 takes place in regions 404, 406 not protected by the overlying patterned photoresist 402.

FIG. 5 illustrates the results of a dry reactive ion etching (RIE) process to remove most (e.g. approximately 90%) of the first dielectric layer 308 to form intermediary first and second vias 502, 504. The RIE process can provide for steep (e.g. approximately vertical) sidewalls (e.g. an anisotropic etch) that reproduces the lateral pattern of the photoresist 402 in the etched oxide dielectric, but RIE is not able to stop etching without undesirably altering/damaging the semiconductor device 302, 304 surface if the RIE was permitted to remove all the oxide reaching the semiconductor 302, 304 surface. FIG. 6 illustrates removal of the remainder of the first dielectric layer 308 using a wet buffered oxide etch (BOE). When the BOE finishes the via etch by removing the remaining (approximately 10%) of initial oxide thickness, it stops at the semiconductor device 302, 304 surface. In some embodiments, the BOE leaves a damage-free SiC surface on the semiconductor devices 302, 304 to facilitate subsequent reproducible good ohmic contact formation.

In some embodiments, BOE etching can undercut the lateral photoresist pattern (i.e., make the lateral size of a via larger than the photoresist pattern, as indicated in FIG. 6 in simplified fashion) as BOE etching of oxide is more isotropic in nature. However, removing approximately 0.1 microns of material (i.e., the last 10% of oxide thickness because the RIE removed the preceding 90% of oxide thickness) minimizes this effect as BOE etch times are kept relatively short compared to times for a wet BOE for 100% of the via etch. To ensure that liquid BOE reaches the bottom of the via for full desired etch depth (e.g. to overcome microscopic-feature liquid surface tension effects known in the art that might have prevented this), the BOE liquid solution with the wafer immersed can be subjected to ultrasonic agitation during the BOE wet etch.

Figure 7:
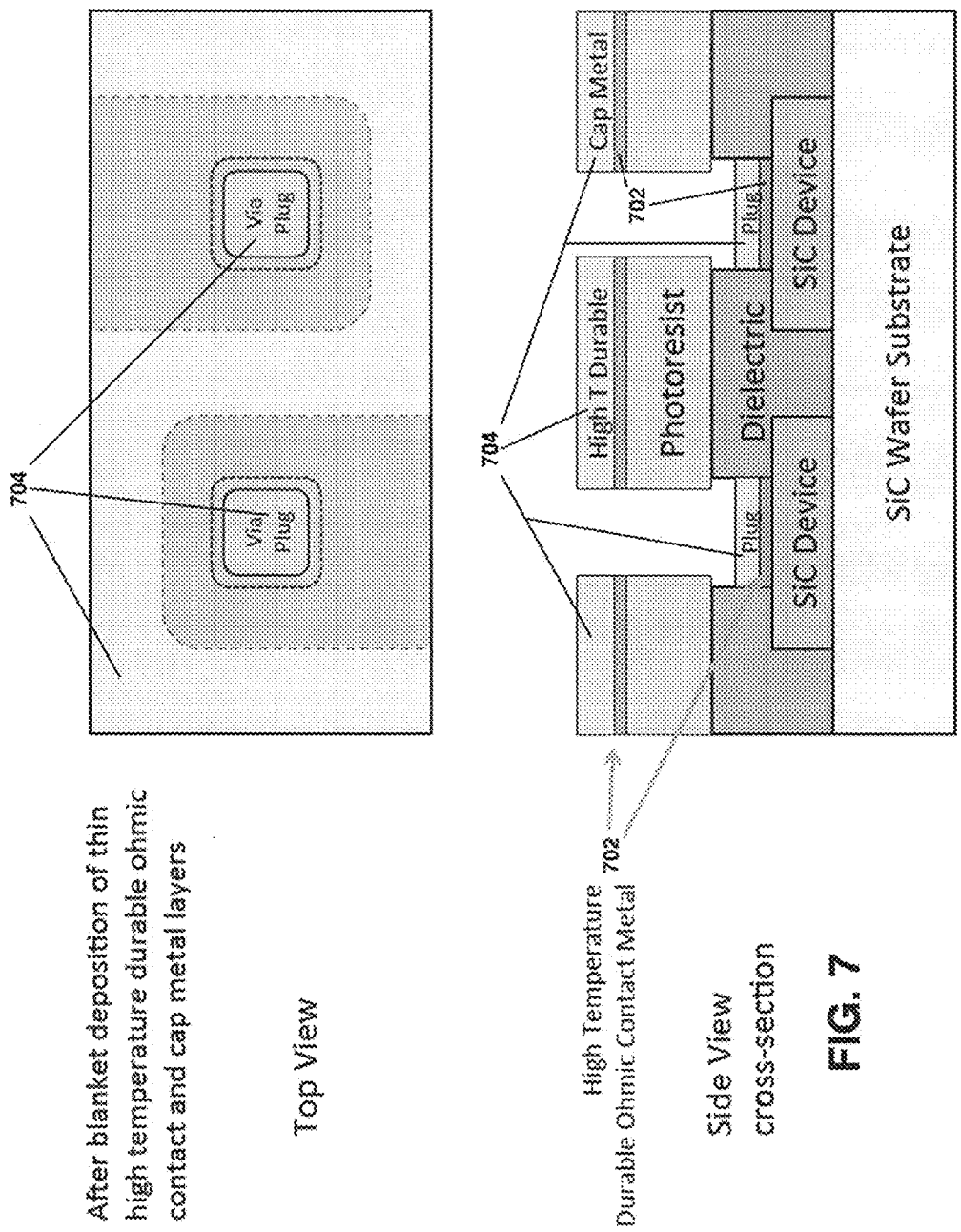

FIG. 7 illustrates a deposition of thin high temperature durable ohmic contact metal layer 702 followed by thin protective layer of oxidation-resistant high temperature durable interconnect metal 704. In some embodiments, the wafer (with the first dielectric 308 and photoresist 402 pattern still present) is loaded into a vacuum metal deposition system to deposit the metal layers 702, 704. In some embodiments, the metal layers 702, 704 are deposited without breaking the vacuum between the deposition of the two or more metal layers. In some embodiments, to minimize native oxide formation that occurs on the freshly exposed SiC surface in room air, this loading preferably takes place less than 1 hour after the BOE wet etch is completed and quenched with deionized water rinsing.

In some embodiments, an ultrahigh vacuum (UHV) sputter deposition can be employed. In other embodiments, the high temperature durable ohmic contact metal 702 deposited can be made of Titanium or Hafnium. The high temperature durable ohmic contact metal layer 702 can be approximately 50 nanometers in thickness. It is appreciated that other metals, metal alloys, and multi-level metal/alloy stacks deposited with other vacuum metal deposition methods could be used provided they can be patterned by liftoff and yield desired electrical and physical ohmic contact properties. For example, the following metals can also be employed as thin high temperature contact metals 702: Vanadium, Chromium, Zirconium, Niobium, Molybdenum, Tantalum, and Tungsten. It is appreciated that compounds of silicides and carbides of these metal elements could also be employed as high temperature contact metals 702 with different compound phases and deposition and annealing techniques. The metal deposition process does not damage/degrade the photoresist to the degree that successful subsequent "liftoff patterning" removal of the photoresist and metal that resided on top of said photoresist is precluded.

In some embodiments, to preserve the photoresist liftoff integrity, the target-to-substrate distance used for the UHV sputter was 50 mm, and the substrate was electrically grounded with the vacuum chamber metal during the sputter.

It is appreciated that numerous methods and materials for forming ohmic contacts to SiC are known in the art. Moreover, aspects of the innovation, counter to methods known, do not address any temperature greater than 500 C durable SiC ohmic contact process wherein SiC ohmic contact patterning has been accomplished using only photoresist (i.e., without an additional photoresist-pattern metal etch mask pattern), the same patterned photoresist layer that was used to pattern the first dielectric 308, etch vias 602, 604 and without high-temperature vacuum environment pre-sputter bake to mitigate oxygen contamination.

A number of suitable durable ohmic contact metal films to SiC, including Titanium and Hafnium, are known to react with atmospheric oxygen to form metal-oxides that undesirably degrade ohmic contact conductivity and adhesion. To minimize this degradation mechanism, the in-situ deposition (i.e. without breaking vacuum) of an overlying oxidation-resistant metal thin film 704 to protect the ohmic contact metal from atmospheric oxygen exposure is employed. This overlying protective metal layer 704 can durably withstand prolonged IC operation for temperatures greater than or equal to 500 C. In some embodiments, the overlying protective metal layer 704 is made of tantalum silicide (TaSi2) that is approximately 0.2 micrometers thick and sputtered in the same UHV deposition system (without breaking vacuum) as the ohmic contact metal 702.

Figure 8:
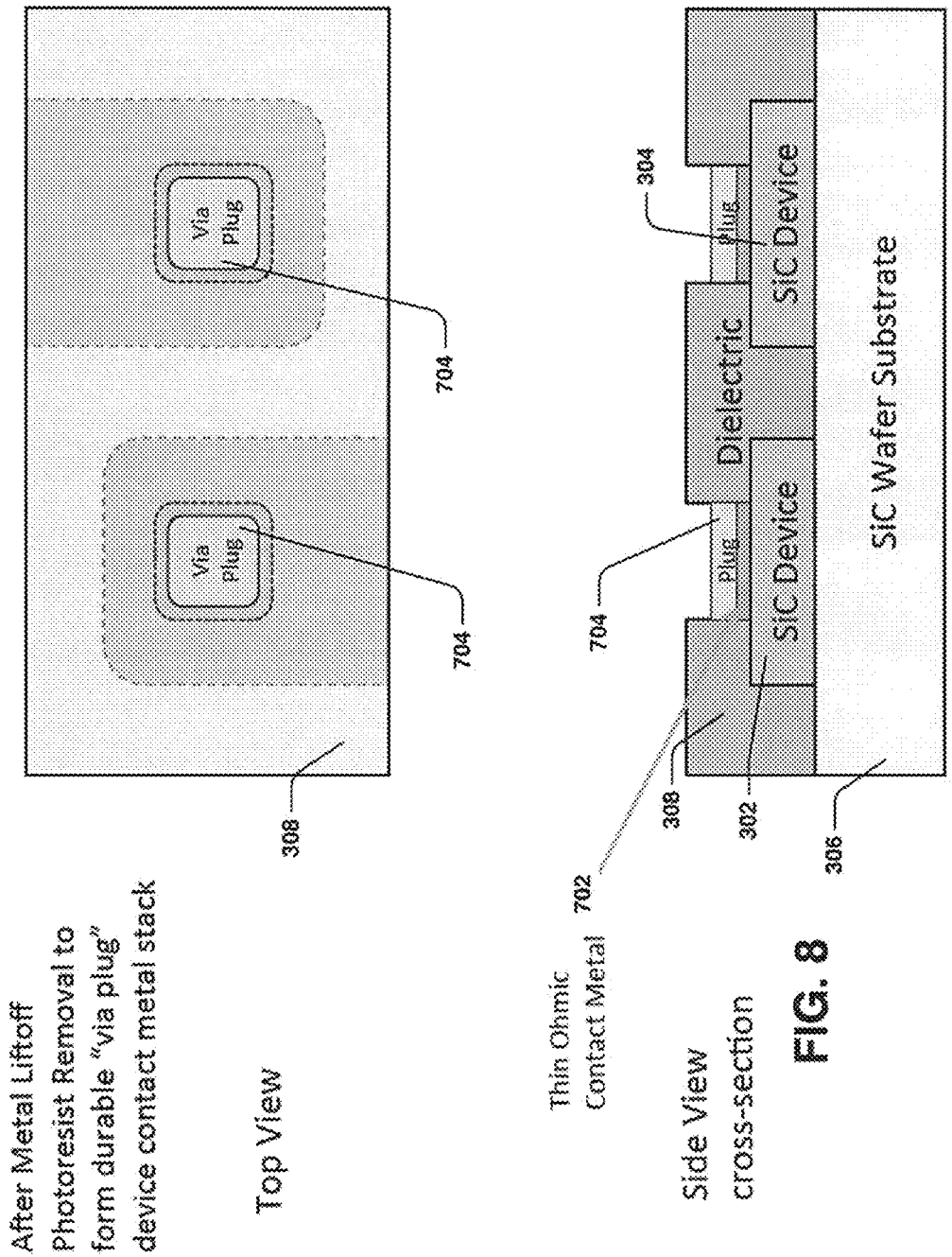

FIG. 8 illustrates an intermediary configuration of the IC following both UHV depositions and subsequent liftoff removal of photoresist 402 leaving behind desired "via plug" pattern of ohmic layer 702 and protective high temperature metal layer 704 residing on the SiC device surface 302, 304 at the bottom of the etched vias 602, 604 through the first dielectric 308. In some embodiments, the liftoff removal is accomplished using wet chemical solvents to dissolve the photoresist. In some embodiments liftoff removal is followed by a dry plasma photoresist cleaning process. It is appreciated that the fabrication process described and FIG. 8 intermediary configuration minimize/protect ohmic layer 702 from detrimental oxygen exposure.

Figure 9:
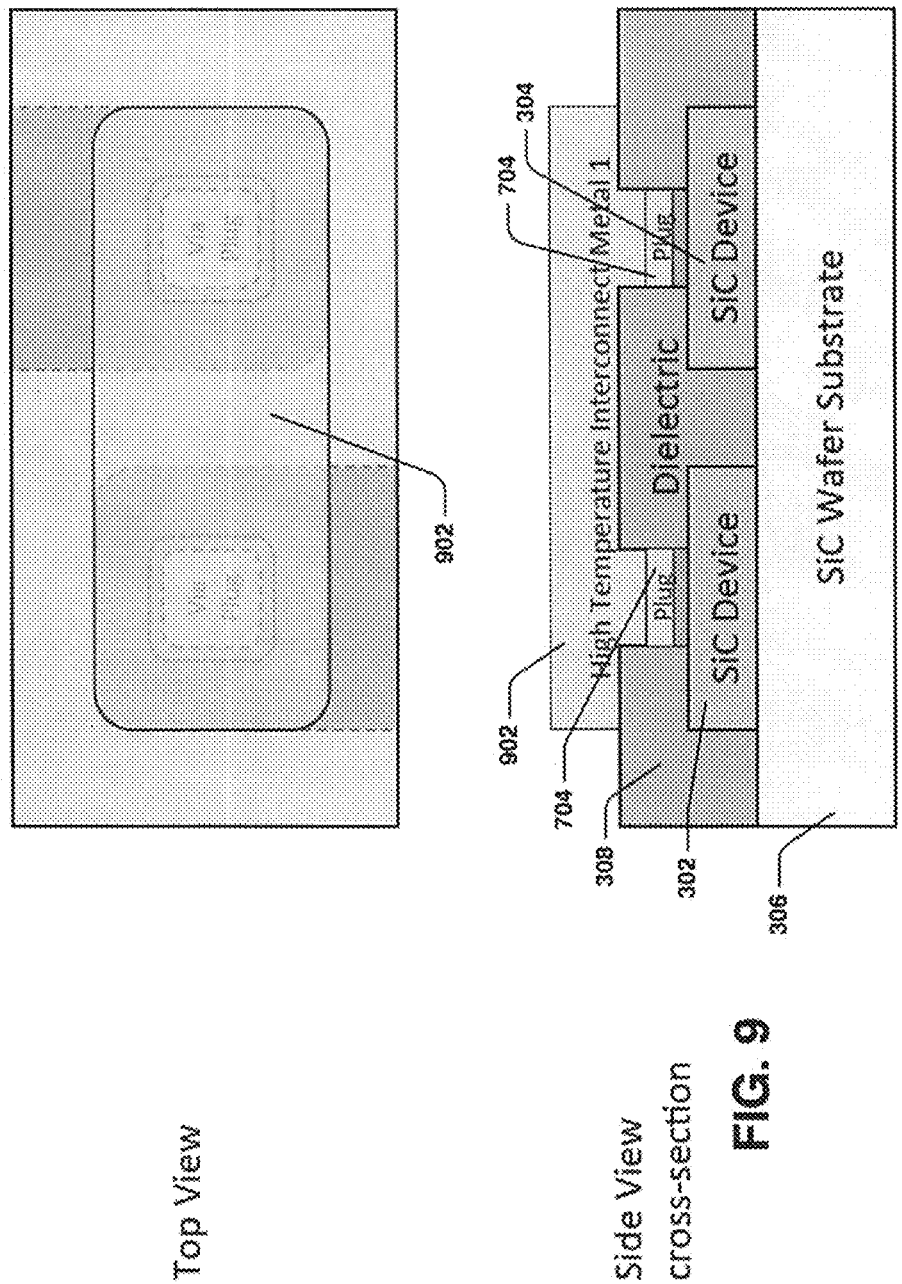

FIG. 9 illustrates the completion of the electrical/physical first level interconnection of the separate semiconductor devices 302, 304 by forming a patterned electrically conductive trace of high temperature (e.g. temperature greater than 500 C) durable metal 902 between the two via plugs 704. In some embodiments, the lateral extent of this patterned interconnect metal 902 can be larger than the lateral extent of the vias 602, 604 to better protect (e.g. seal) the oxygen sensitive ohmic-contact metal 702 from atmospheric oxygen. In some embodiments, the high temperature durable metal interconnects are patterned to extend laterally across the substrate lateral area to form electrical connections for integrated circuit function.

In some embodiments, the high temperature durable interconnect metal 902 is a 0.8 micrometer thick film of tantalum silicide (TaSi2) that is substantially uniform and dense. In this embodiment, the film is blanket-deposited using close-proximity sputtering (e.g. less than 3 cm target-to-substrate distance) in a UHV system. Prior to the sputtering, a one-hour substrate bake at 300 C is employed with subsequent cool-down to less than 100 C to mitigate oxygen (e.g. water vapor) contamination, and the substrate 306 was electrically floating during the sputter deposition. The film can be laterally patterned using photolithography and dry etching techniques.

Figure 10:
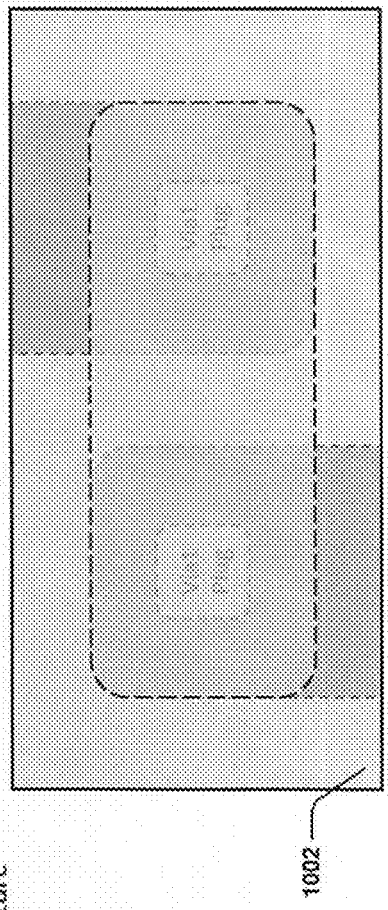
Figure 10:
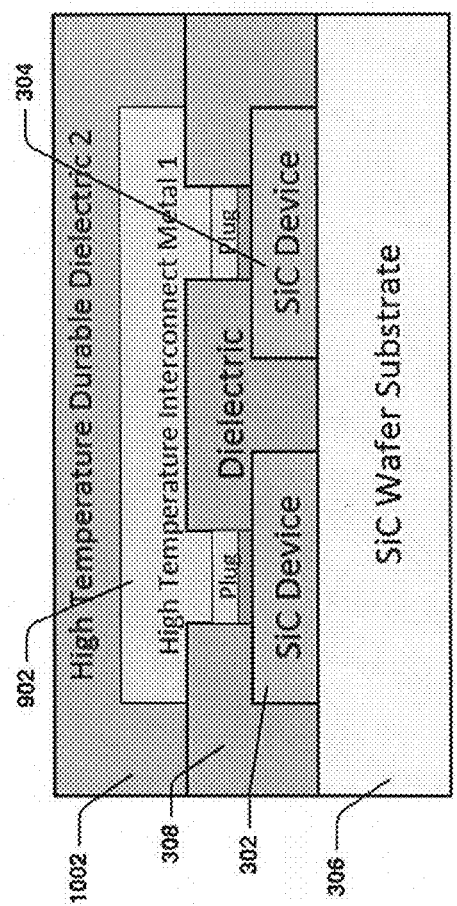

FIG. 10 illustrates a second overlying dielectric layer ("Dielectric 2" as labeled in the FIGURES) 1002 deposited across the lateral substrate area, including on top of the first metal level interconnect ("Metal 1") 902. The second dielectric layer 1002 can further protect the oxygen-sensitive ohmic contact metal-SiC interface. During prolonged IC operation at 500 C, the second dielectric layer 1002 can protect the high temperature durable interconnect metal 902. For the embodiment where metal 902 is a 0.8 micrometer thick film of tantalum silicide (TaSi2), it has been observed that TaSi2 detrimentally oxidizes when exposed to air for long time periods at 500 C. When protected from air by dielectric 1002, the TaSi2 interconnect does not detrimentally oxidize.

It is appreciated that the intermediary IC structure depicted in FIG. 10 forms a single-level interconnect foundation for realizing 500 C durable integrated circuits of limited complexity and functionality. However, modern integrated circuits can be implemented using the advantages (including greatly increased complexity) offered by multiple levels of interconnects. The intermediary IC structure depicted in FIG. 10 results in a high-temperature durable first metal level interconnect 902 that serves as a foundation for an implementation of a second metal level interconnect of extreme high-temperature durability that is illustrated in FIGS. 11-13.

Figure 11:
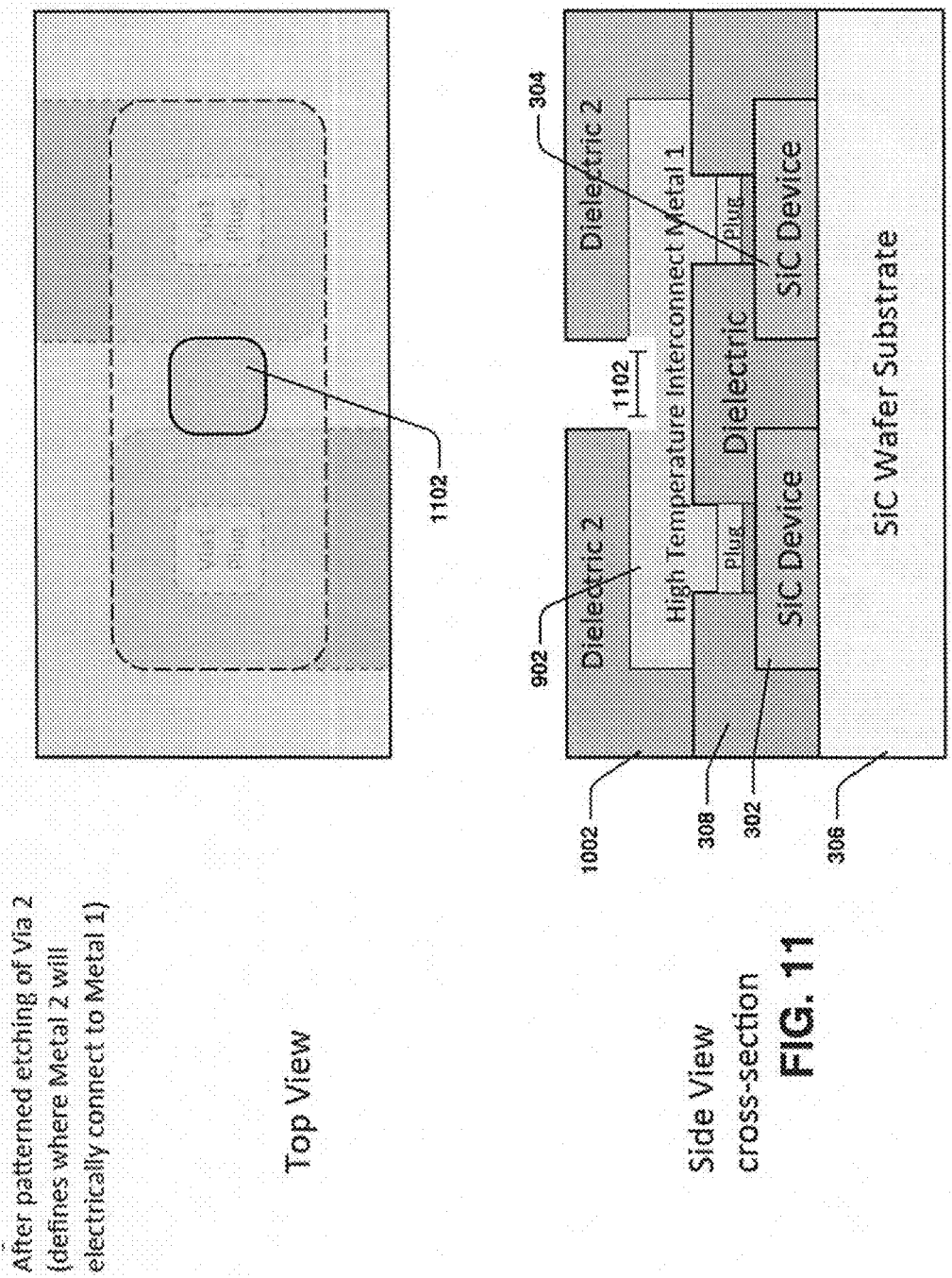

FIG. 11 illustrates patterned etching of a third via 1102 that can facilitate an electrical connection between first-level patterned high temperature interconnect layer 902 (i.e., "Metal 1") and a second-level patterned high temperature durable interconnect metal layer. In some embodiments, the third via 1102 is dry etched into the second dielectric 1002 for maximum lateral pattern accuracy. In some embodiments, the pattern can be "over-etched" to remove some of the underlying first interconnect metal 902 without harming circuit functionality so long as the first interconnect metal 902 is not completely removed by the over etch in the third via 1102.

Figure 12:
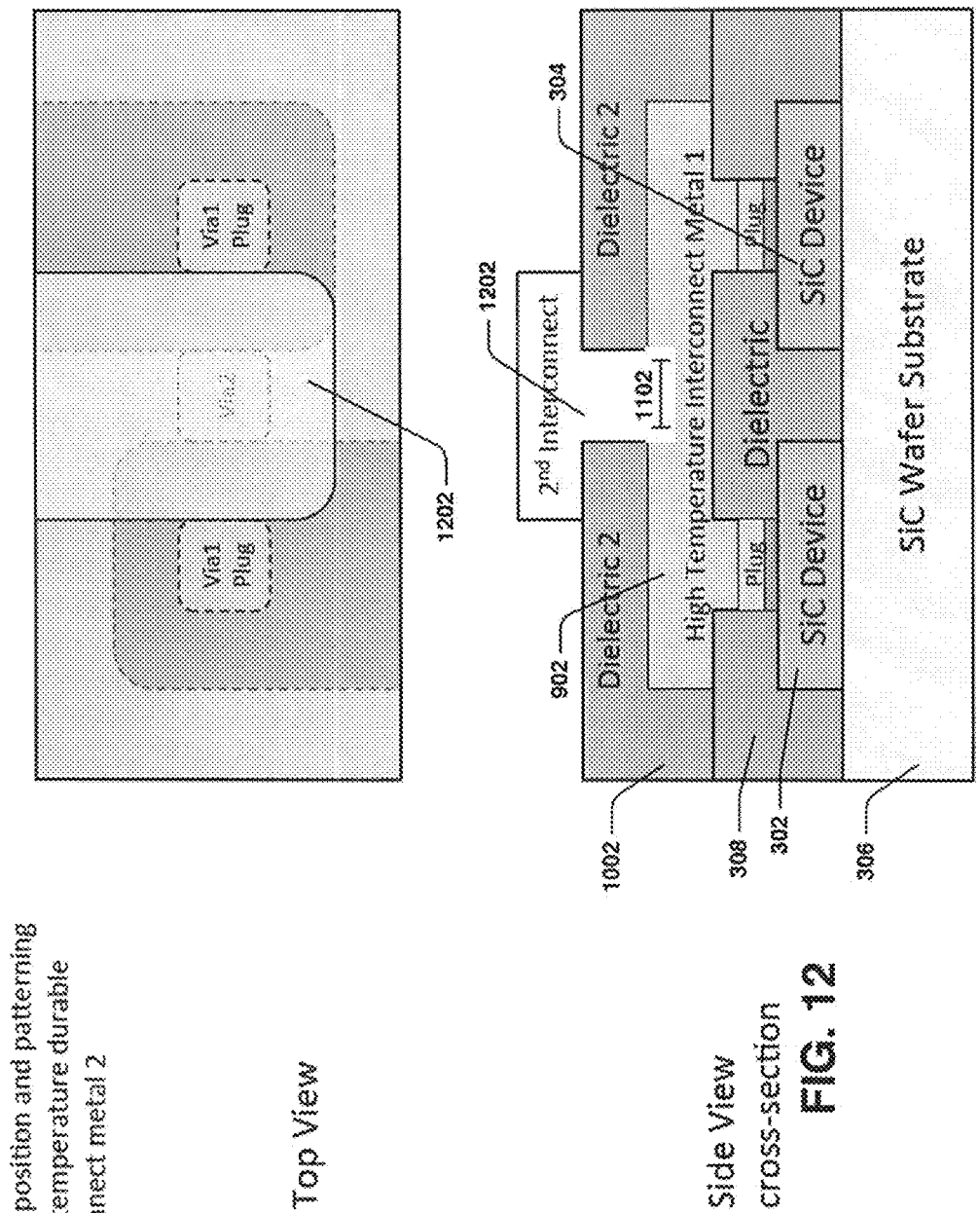
Figure 13:
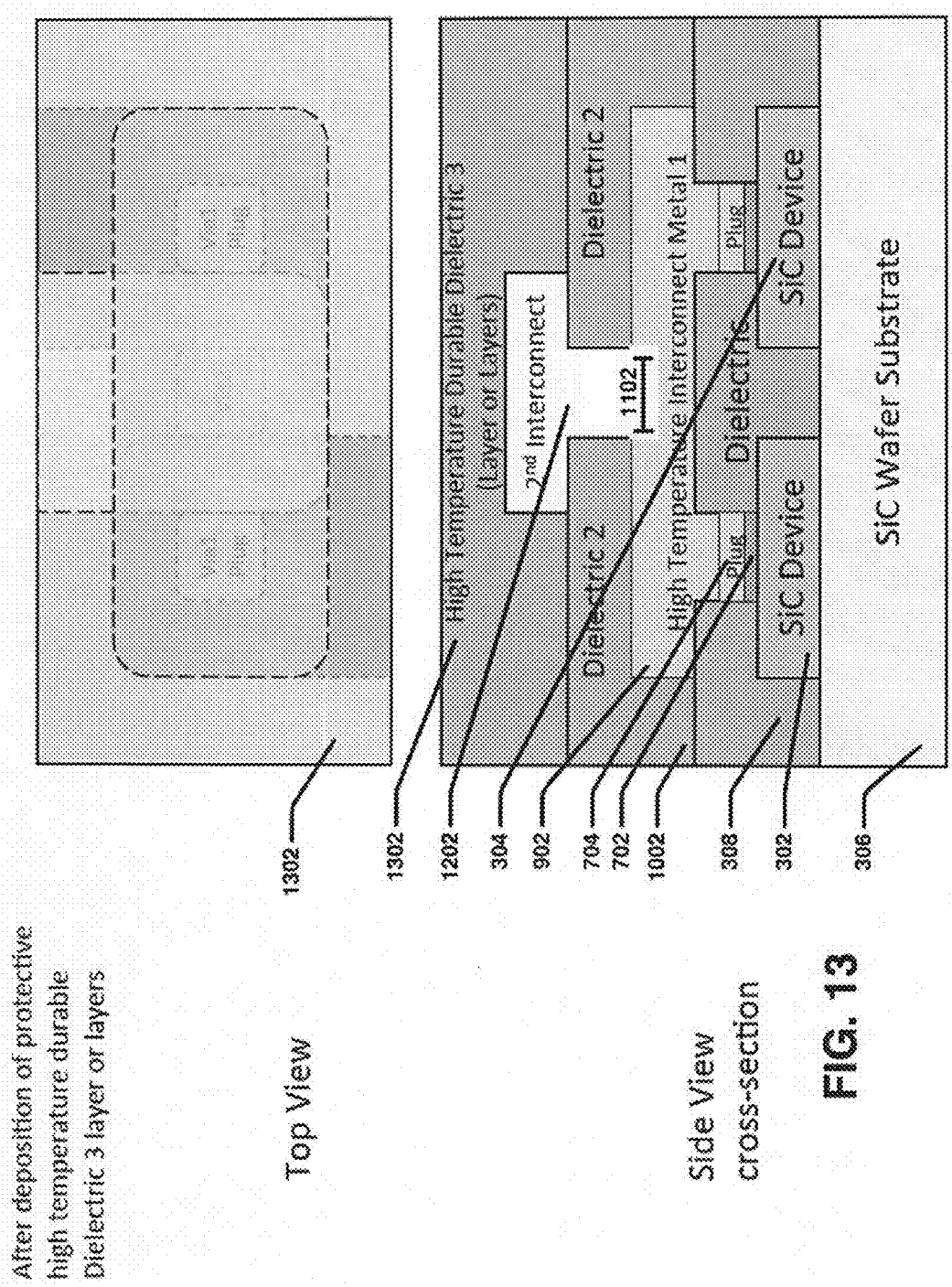
FIG. 13 illustrates a completed integrated circuit device according to aspects herein.

FIG. 12 illustrates a second high temperature durable metal interconnect 1202 that is deposited and patterned. The third via 1102 enables electrical connection where desired between the first interconnect metal 902 and the second interconnect metal 1202. In some embodiments, the second dielectric 1002 is tetraethyl orthosilicate (TEOS) SiO2 and the high temperature durable interconnect metal 1202 is 0.8 micrometer thick film that is substantially uniform and dense. The high temperature durable interconnect metal 1202 can be made of TaSi2 that is blanket-deposited by close-proximity sputtering (e.g. less than 3 cm target-to-substrate distance) in a UHV system. The high temperature durable interconnect metal 1202 can be laterally patterned by photolithography and dry etching.

It is appreciated to that the first metal interconnect 902 and the second metal interconnect 1202 can be deposited in patterns that can extend across the substrate according to a circuit design. The pattern can extend to areas on the substrate where there are no underlying first interconnect metal and/or no underlying devices.

FIG. 13 illustrates an overlying third dielectric layer or layers ("Dielectric 3") 1302 that can be deposited and patterned on top the second interconnect metal 1202 structure to form the finalized IC structure. The structure depicted with two levels of metal interconnect can successfully enable realization of complicated integrated circuitry that can function for long time periods (e.g. thousands of hours) and at high temperatures (e.g. temperature greater than or equal to 500 C). In some embodiments, the third dielectric layer 1302 is multiple layers made of approximately 1 micrometer thick SiO2, approximately 67 nm thick Si3N4, and approximately 1 micrometer thick SiO2.

Figure 14:
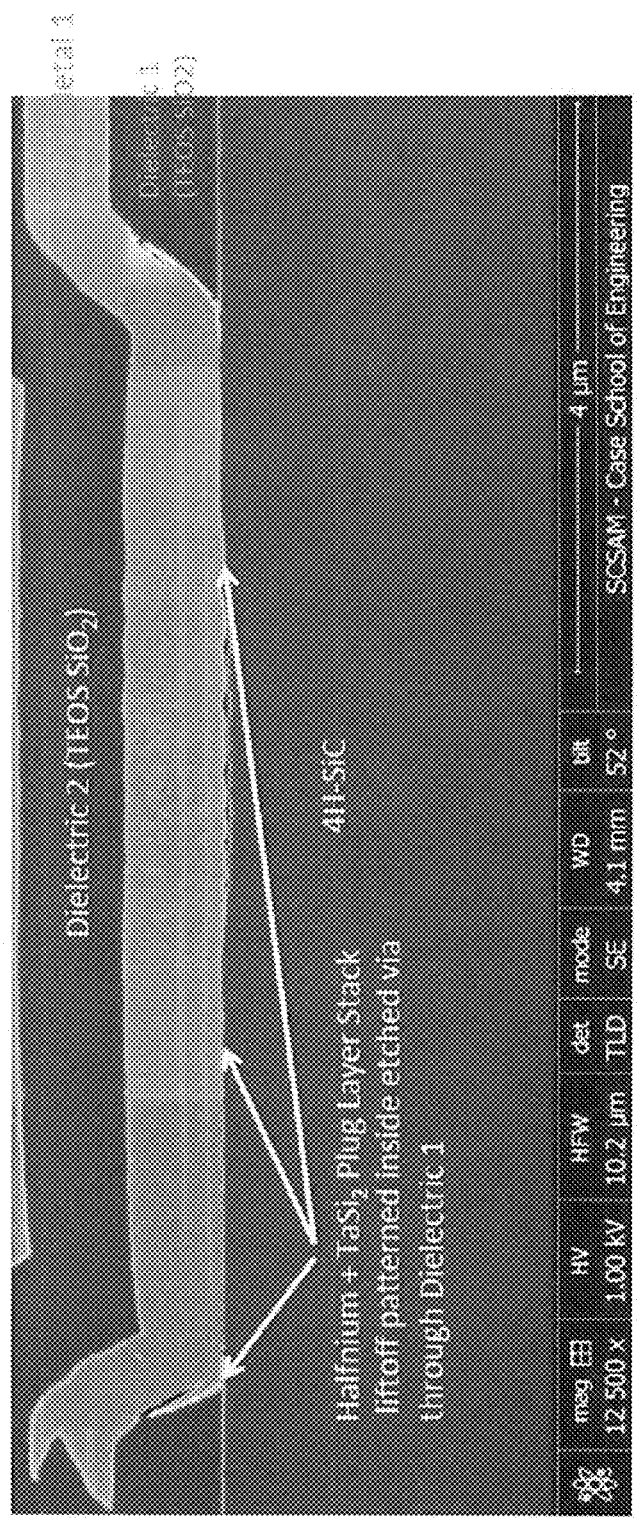
FIG. 14 illustrates a scanning electron micrograph close-up of the cross-section of FIG. 13.

FIG. 14 shows a scanning electron micrograph close-up of the cross-section (prepared by focus ion-beamed milling of a sample) of an experimentally implemented high-temperature durable contact via plug implemented using the IC structure of FIG. 13. It is appreciated that part of the FIG. 13 structure is seen in the close-up. The detailed experimentally obtained physical profiles of the via plug metallization layers 702, 704 (Hf and TaSi2) residing on top of phosphorous implant doped 4H—SiC are visible inside the etched oxide via, over-coated by the subsequently deposited first metal TaSi2 interconnect 902.

Figure 15:
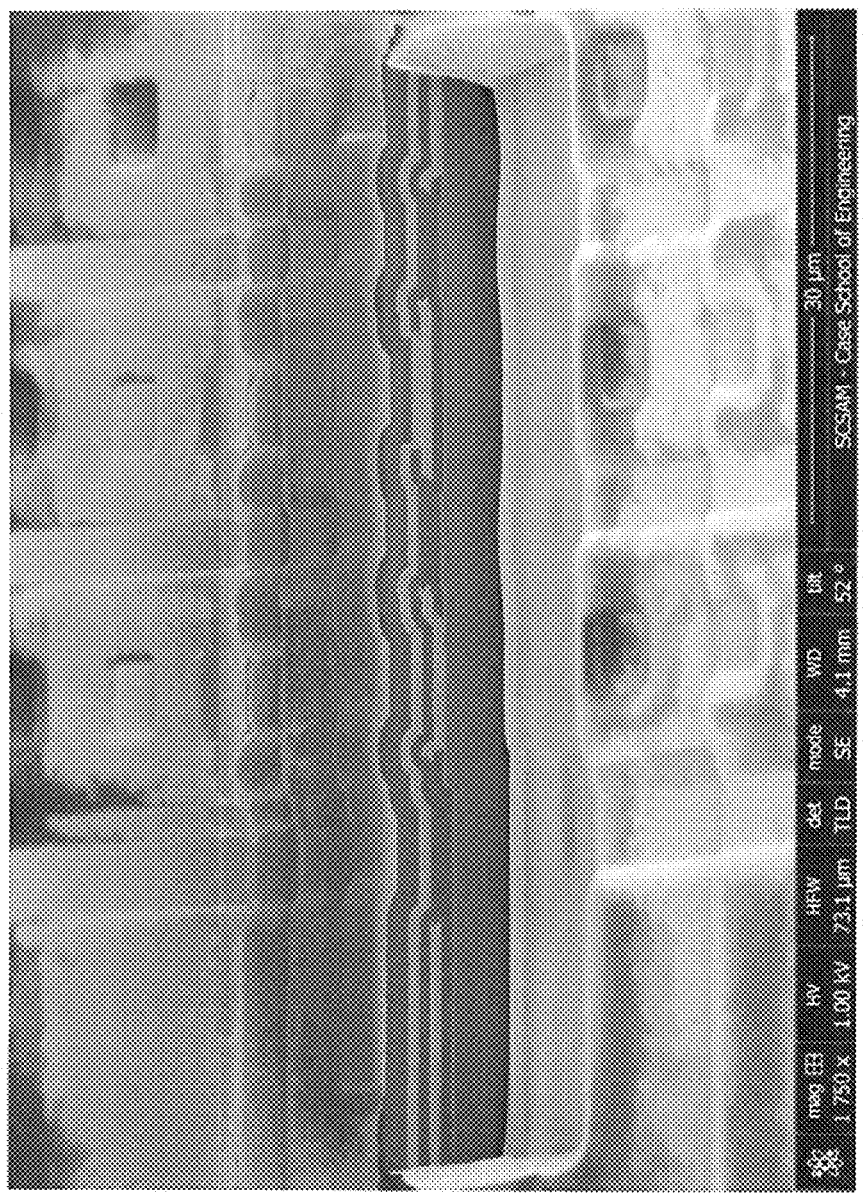
FIG. 15 shows a cross-sectional micrograph of a specific embodiment of the structure of FIG. 13.

FIG. 15 shows a similar cross-sectional micrograph of a specific embodiment of the structure of FIG. 13. The specific embodiment is an experimental two-level interconnect stack that includes a via plug contact 702, 704 to the SiC device 302, 304, a first TaSi metal interconnect 902, a second metal interconnect 1202, a via 1102 between the first metal interconnect 902 and second metal interconnect 1202, and insulating dielectric layers 308, 1002, 1302 that is made of SiO2, silicon nitride, and SiO2 respectively.

Figure 16:
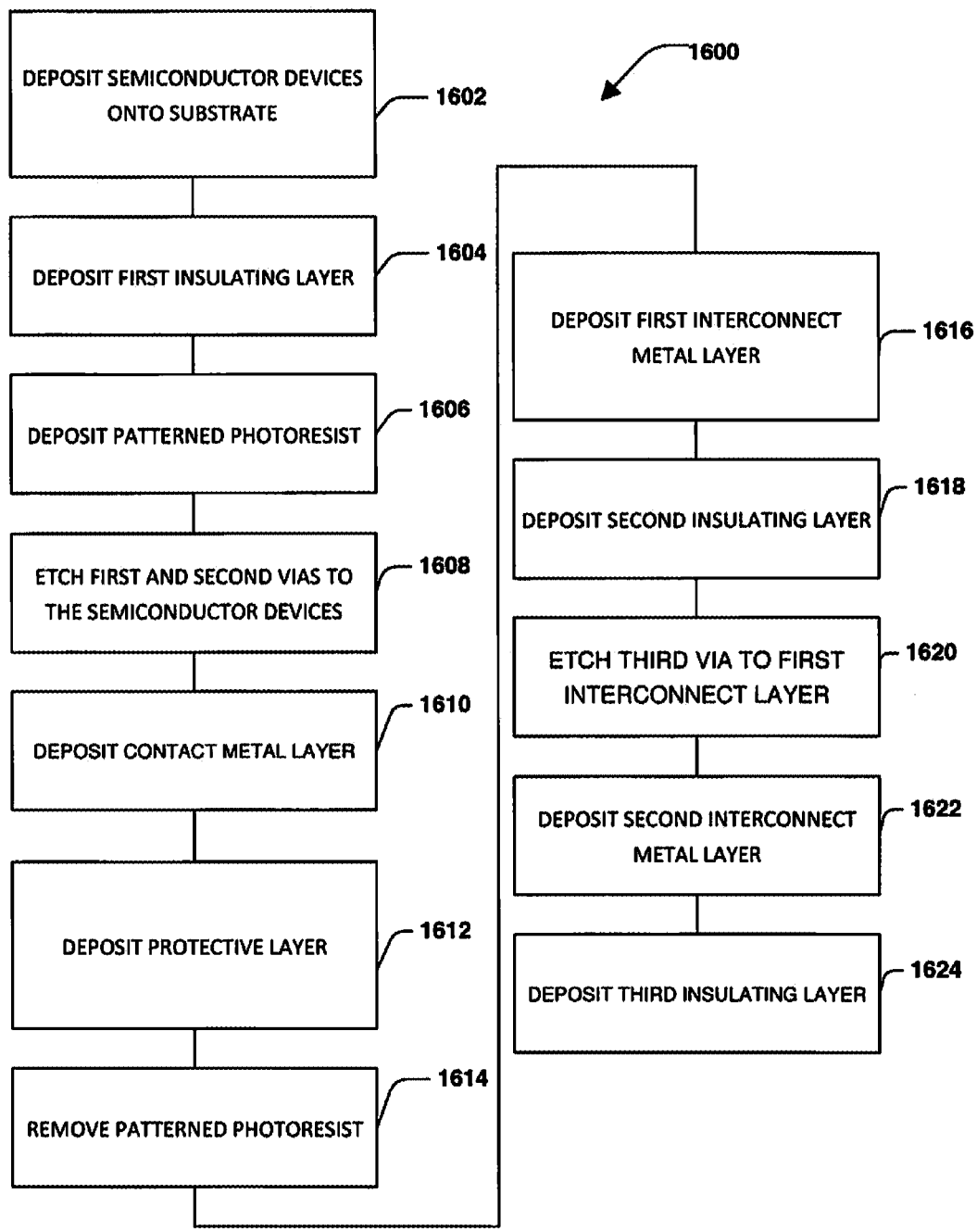
FIG. 16 illustrates a method for fabricating an integrated circuit device.

FIG. 16 illustrates a method 1600 for fabricating an integrated circuit. At 1602, a first semiconductor device and a second semiconductor device are constructed on a substrate. At 1604, a first insulating layer is deposited that covers substantially the first semiconductor device, the second semiconductor device, and the substrate and its lateral extent (substantially entire substrate lateral area). At 1606, a patterned photoresist is deposited over the first insulating layer. The patterned photoresist defines a pattern for a first via to the first semiconductor device through the first insulating layer and a second via for the second semiconductor device through the first insulating layer. At 1608, the first via and the second via is etched through the first insulating layer using the patterned photoresist as an etch mask that confines etching of the first insulating layer to occur in regions where there is no overlying photoresist. Except for small-dimension lateral over-etch to be described, the first insulating layer is preserved (e.g. not etched) in regions directly beneath photoresist.

At 1610, a contact metal layer is deposited onto the substrate lateral area including the first semiconductor device and the second semiconductor device and regions with the patterned photoresist. At 1612, a protective layer is deposited onto the substrate lateral area including the contact metal layer and regions with the patterned photoresist. At 1614, the patterned photoresist is removed along with the metals that resided on top of the photoresist, so that the contact metal layer and protective layer remain in the regions on the first semiconductor device and the second semiconductor device where there was no overlying photoresist at the time that contact metal layer and protective layers were deposited. At 1616, a first interconnect metal layer is deposited and patterned. The first interconnect metal layer electrically connects the first semiconductor device to the second semiconductor device via the contact metal layer and the protective layer.

At 1618, a second insulating layer is deposited over the substrate lateral area including the first interconnect metal layer. At 1620, a third via is pattern etched through part of the second insulating layer to the first interconnect metal layer. At 1622, a second interconnect metal layer is deposited and patterned into the third via deposited over the patterned first interconnect metal layer such that the third via is filled with the second interconnect metal layer. At 1624, a third insulating layer is deposited over the substrate lateral area including the second interconnect metal layer. It is appreciated that insulating layers and metal layers are patterned according to circuit designs to extend laterally across a substrate chip/wafer.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks. The methods described herein are limited to statutory subject matter under 35 U.S.C § 101.

To the extent that the term "includes" or "including" is employed in the detailed description or the claims, it is intended to be inclusive in a manner similar to the term "comprising" as that term is interpreted when employed as a transitional word in a claim.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims, which satisfy the statutory subject matter requirements of 35 U.S.C. § 101.

Various operations of embodiments are provided herein. The order in which one or more or all of the operations are described should not be construed as to imply that these operations are necessarily order dependent. Alternative ordering will be appreciated based on this description. Further, not all operations may necessarily be present in each embodiment provided herein.

As used in this application, "or" is intended to mean an inclusive "or" rather than an exclusive "or". Further, an inclusive "or" may include any combination thereof (e.g., A, B, or any combination thereof). In addition, "a" and "an" as used in this application are generally construed to mean "one or more" unless specified otherwise or clear from context to be directed to a singular form. Additionally, at least one of A and B and/or the like generally means A or B or both A and B. Further, to the extent that "includes", "having", "has", "with", or variants thereof are used in either the detailed description or the claims, such terms are intended to be inclusive in a manner similar to the term "comprising".

Further, unless specified otherwise, "first", "second", or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. An integrated circuit device having a plurality of layers, the layers comprising:
   a substrate;
   a first semiconductor device including a first semiconductor device surface fabricated onto a portion of the substrate;
   a second semiconductor device including a second semiconductor device surface constructed onto a second portion of the substrate such that the second semiconductor device is laterally spaced from the first semiconductor device;
   a first insulating layer patterned onto part of the first semiconductor device such that a first via is formed on a first device contacting surface from part of the first semiconductor device surface, and patterned onto part of the second semiconductor device such that a second via is formed on a second device contacting surface is part of the second semiconductor device surface, and the substrate;
   a contact metal layer deposited onto the first device contacting surface and the second selected device contacting surface;
   a protective layer deposited onto the contact metal layer; and
   a first interconnect metal layer deposited and patterned such that it electrically connects the first semiconductor device to the second semiconductor device via the contact metal layer and the protective layer.

2. The integrated circuit device of claim 1, further comprising:
   a second insulating layer deposited over part of the first interconnect metal layer, wherein the second insulating layer leaves a third via;
   a second interconnect metal layer deposited over the remaining part of the first interconnect metal layer such that the third via is filled with the second interconnect metal layer; and
   a third insulating layer deposited over the second interconnect metal layer.

3. The integrated circuit device of claim 1, wherein the first via opening part of the first semiconductor device and the second via opening part of the second semiconductor device traverses through the first insulating layer to connect the first semiconductor to the first interconnect metal layer through the contact metal layer and the protective layer.

4. The integrated circuit device of claim 2, wherein the second interconnect metal layer laterally overlaps the third via and vertically extends a distance above the second insulating layer.

5. The integrated circuit device of claim 1, wherein the protective layer overlaps the entirety of the contact metal layer to form a plug.

6. The integrated circuit device of claim 1, wherein the protective layer is made of tantalum silicide.

7. The integrated circuit device of claim 1, wherein the first insulating layer, the contact metal layer, and protective layer are patterned using the same photoresist pattern.

8. The integrated circuit device of claim 1, wherein the contact metal layer is made of hafnium to form a durable high temperature ohmic contact for the first semiconductor device and for the second semiconductor device.

9. The integrated circuit device of claim 1, wherein the integrated circuit device can operate over substantially long time period at a substantially high temperature range.

10. The integrated circuit device of claim 9, where in the integrated circuit device can operate for over one thousand hours at a temperature over five hundred degrees Celsius.

11. The integrated circuit device of claim 1, wherein the first semiconductor device and the second semiconductor device is comprised of a transistor, a resistor, diode, detector, or other semiconductor device.

12. A method for fabricating an integrated circuit device, comprising:
   fabricating a first semiconductor device and a second semiconductor device on a substrate;
   depositing a first insulating layer covering substantially the first semiconductor device, the second semiconductor device, and the substrate;
   depositing a patterned photoresist over the first insulating layer, wherein the patterned photoresist defines a pattern for a first via to the first semiconductor device through the first insulating layer and a second via for the said second semiconductor device through the first insulating layer;
   etching the first via and the second via through the first insulating layer using the patterned photoresist to locate the first via and the second via;
   depositing a contact metal layer onto the first semiconductor device and the second semiconductor device using the patterned photoresist to deposit into the first via and the second via;
   depositing a protective layer onto the contact metal layer using the patterned photoresist to deposit into the first via and the second via;
   removing the patterned photoresist such that the contact metal and the protective layer remain on the first semiconductor device and the second semiconductor device in the first via and the second via; and
   depositing and patterning a first interconnect metal layer that electrically connects the first semiconductor device to the second semiconductor device via the contact metal layer and the protective layer.

13. The method of claim 12, further comprising:
   depositing a second insulating layer over the first interconnect metal layer;
   pattern etching a third via through part of the second insulating layer to the first interconnect metal layer;
   depositing and patterning a second interconnect metal layer into the third via such that the third via is filled and electrically connected with the second interconnect metal layer; and
   depositing a third insulating layer deposited over the second interconnect metal layer.

14. The method of claim 13, wherein the second interconnect metal layer laterally overlaps the third via and vertically extends a distance above the second insulating layer.

15. The method of claim 12, wherein the first via and the second via is formed using a combination of a dry reactive ion etching technique and a wet buffered oxide etching technique.

16. The method of claim 12, wherein the contact metal layer and the protective layer are deposited in a vacuum using a vacuum metal deposition system.

17. The method of claim 16, wherein the contact metal layer and the protective layer are deposited in succession over a short time period using the vacuum metal deposition system, wherein the vacuum is unbroken during depositing the contact metal layer and the protective layer.

18. The method of claim 17, wherein the substrate is not heated while the substrate is in the vacuum metal deposition system.

19. The method of claim 12, wherein the contact metal layer and the protective layer are deposited using a ultrahigh vacuum sputter deposition technique.

* * * * *